(12) United States Patent
Huang et al.

(10) Patent No.: US 8,441,829 B2
(45) Date of Patent: May 14, 2013

(54) STABLE SRAM CELL

(75) Inventors: Huai-Ying Huang, Jhonghe (TW);
Yu-Kuan Lin, Jhonghe (TW); Sheng Chiang Hung, Hsin-Chu (TW);
Feng-Ming Chang, Chia-yi (TW);
Jui-Lin Chen, Taipei (TW); Ping-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 561 days.

(21) Appl. No.: 12/727,985

(22) Filed: Mar. 19, 2010

(65) Prior Publication Data
US 2010/0315862 A1  Dec. 16, 2010

Related U.S. Application Data

(60) Provisional application No. 61/186,580, filed on Jun. 12, 2009.

(51) Int. Cl.
*G11C 15/00* (2006.01)
(52) U.S. Cl.
USPC ........ 365/49.11; 365/49.1; 365/154; 365/156
(58) Field of Classification Search .................. 365/154, 365/156, 174, 188, 195, 202, 204, 206, 49.1, 365/49.11
See application file for complete search history.

(56) References Cited

U.S. PATENT DOCUMENTS

| | | | |
|---|---|---|---|
| 7,164,596 B1 | 1/2007 | Deng et al. | |
| 7,365,432 B2 | 4/2008 | Liaw | |
| 7,843,721 B1 * | 11/2010 | Chou et al. | 365/177 |
| 2007/0201262 A1 | 8/2007 | Joshi et al. | |
| 2007/0268747 A1 * | 11/2007 | Lin et al. | 365/185.07 |
| 2007/0274140 A1 | 11/2007 | Joshi et al. | |
| 2008/0123462 A1 | 5/2008 | Liaw | |
| 2008/0137440 A1 | 6/2008 | Liaw | |
| 2008/0192561 A1 | 8/2008 | Huang et al. | |
| 2009/0034345 A1 | 2/2009 | Chan et al. | |

OTHER PUBLICATIONS

Joshi, R., et al., "6.6+ GHz Low Vmin, read and half select disturb-free 102 Mb SRAM," IEEE, 2007 Symposium on VLSI Circuits Digest of Technical Papers, pp. 250-251.

(Continued)

*Primary Examiner* — Tuan T Nguyen
*Assistant Examiner* — Hien Nguyen
(74) *Attorney, Agent, or Firm* — Slater & Matsil, L.L.P.

(57) ABSTRACT

SRAM cells and SRAM cell arrays are described. In one embodiment, an SRAM cell includes a first inverter and a second inverter cross-coupled with the first inverter to form a first data storage node and a complimentary second data storage node for latching a value. The SRAM cell further includes a first pass-gate transistor and a switch transistor. A first source/drain of the first pass-gate transistor is coupled to the first data storage node, and a second source/drain of the first pass-gate transistor is coupled to a first bit line. The first source/drain of the switch transistor is coupled to the gate of the first pass-gate transistor.

20 Claims, 8 Drawing Sheets

OTHER PUBLICATIONS

Nii, Koji, et al., "Synchronous Ultra-High-Density 2RW Dual-Port 8T-SRAM With Circumvention of Simultaneous Common-Row-Access," IEEE Journal of Solid—State Circuits, vol. 44, No. 3, Mar. 2009, pp. 977-986.

Lin, Sheng, et al., "A PVT Tolerant Low Leakage and Highly Stable 9 Transistor 32nm CMOS SRAM Cell," IEEE Transactions on Very Large Scale Integration Systems, http://www.princeton.edu/~tvlsi/, Jun. 2008, 9 pages.

Chang, Leland, et al., "Stable SRAM Cell Design for the 32 nm Node and Beyond," IEEE, 2005 Symposium on VLSI Technology Digest of Technical Papers, pp. 128-129.

Ishikura, Satoshi, et al., "A 45 nm 2-port 8T-SRAM Using Hierarchical Replica Bitline Technique With Immunity From Simultaneous R/W Access Issues," IEEE Journal of Solid State Circuits, vol. 43, No. 4, Apr. 2008, pp. 938-945.

Nii, K., et al., "A 65 nm Ultra-High-Density Dual-port SRAM with $0.71um^2$ 8T-cell for SoC," IEEE, 2006 Symposium on VLSI Circuits Digest of Technical Papers, 2 pages.

Lin, Sheng, et al., "A Low Leakage 9T SRAM Cell for Ultra-Low Power Operation," GLSVLSI '08, May 4-6, 2008, Orlando, Fl., 4 pages.

* cited by examiner

STABLE SRAM CELL

This application claims the benefit of U.S. Provisional Application No. 61/186,580 entitled "Stable SRAM Cell", filed on Jun. 12, 2009, which is incorporated herein by reference.

TECHNICAL FIELD

The present invention relates generally to semiconductor memory, and more particularly to stable static random access memory cells.

BACKGROUND

Semiconductor memory devices include, for example, static random access memory, or SRAM, and dynamic random access memory, or DRAM. A DRAM memory cell has only one transistor and one capacitor, so it provides a high degree of integration. Because DRAM requires constant refreshing, its power consumption and slow speed limit its use mainly for computer main memories. The SRAM cell, on the other hand, is bi-stable, meaning it can maintain its state indefinitely as long as an adequate power is supplied. SRAM can operate at a higher speed with lower power dissipation, so computer cache memories use exclusively SRAMs. Other applications include embedded memories and networking equipment memories.

One well-known conventional structure of an SRAM cell is a six transistor (6-T) cell that comprises six metal-oxide-semiconductor (MOS) transistors. As illustrated in FIG. 1, a 6-T SRAM cell 100 comprises two identical cross-coupled inverters 102 and 104 that form a latch circuit, i.e., one inverter's output connected to the other inverter's input. The latch circuit is connected between a power supply and a ground potential.

Referring to FIG. 1, each inverter 102 or 104 comprises an NMOS pull-down transistor 115 or 125 and a PMOS pull-up transistor 110 or 120, respectively. The inverters' outputs serve as two storage nodes, Q and QB. When one of the storage nodes is pulled to low voltage, the other storage node is pulled to high voltage forming a complimentary pair. A complementary bit line pair BL and BLB is coupled to the storage nodes Q and QB via a pair of pass-gate transistors 130 and 135, respectively. The gates of the pass-gate transistors 130 and 135 are connected to a word line WL.

When the word line voltage is switched to a system high voltage, the pass-gate transistors 130 and 135 are turned on to allow the storage nodes Q and QB to be accessible by the bit line pair BL and BLB, respectively. When the word line voltage is switched to a system low voltage, the pass-gate transistors 130 and 135 are turned off and the storage nodes Q and QB are essentially isolated from the bit line pair BL and BLB and the state of the storage nodes Q and QB is maintained almost indefinitely. The cross-coupled inverters 102 and 104 continue to reinforce each other as long as they are isolated from the outside world.

A write operation is performed by applying the state to be written in to the bit line BL and the bit line BLB. For example, for writing a state "1", a system low voltage is applied on the bit line BL, whereas a system high voltage e.g., supply voltage (Vdd), is applied on the bit line BLB. The word line WL is then asserted and the value that is to be stored is latched in overriding the relatively weak transistors of the cross-coupled inverters 102 and 104. When system low voltage is applied on the bit line BL, the PMOS pull-up transistor 120 is overpowered and drives the output of the inverter 102 high, latching "1" in the node QB of the cell.

Prior to the starting time of the read operation, pass-gate transistors 130 and 135 are off since the word line voltage is low, for example, at 0V. The read operation is performed by pre-charging both bit lines BL and BLB to supply voltage Vdd, and then raising the voltage of gates of the pass-gate transistors 130 and 135 to high (through the word line WL). The state of the cell 100 (potential on storage nodes Q and QB) changes the voltage of one of the bit line pair BL and BLB. For example, assuming the previously stored data is 1, which means that storage node Q is at a low voltage and storage node QB is at a high voltage, when word line WL is activated, pass-gate transistors 130 and 135 are turned on. The data "0" stored in the storage node Q will cause the discharge of bit line BL to "0" through pass-gate transistor 130. A sense-amplifier circuit detects a voltage difference between the bit line pair BL and BLB identifying the stored state.

As memory begins to dominate the chip area in high performance applications, SRAM has become the focus of technology scaling. Traditionally, SRAM cell size has scaled with technology scaling. However, at aggressively scaled technologies, variability has increased dramatically, challenging traditional methods to scaling. SRAM devices are most susceptible to both process induced variations as well as intrinsic threshold voltage variations (such as due to random dopant fluctuations) because SRAM devices are fabricated using minimum gate length and gate width devices. Variability is most pronounced in SRAMs because cell operation must be satisfactory for each individual cell with no averaging across multiple cells as in logic.

Consequently, as SRAMs are scaled, sufficient static noise margin (SNM) is difficult to achieve due to both increased variation and noise. In particular, mismatch between reflected SNMs of the two halves of the SRAM cell is enhanced due to aggressive ground rules and dopant fluctuations. Further, at minimum gate length and gate width transistors, the SNM is further degraded due to distortion of the inverter transfer characteristics. Hence, cell stability which determines minimum array operating voltage and yield has thus increasingly become difficult to achieve.

To function properly, the SRAM cell, when charged, must hold a voltage level, either high (logic 1) or low (logic 0). When reading data from the cell or when holding data, the cell current generated (as the pass-gate transistor turns 'on') must not flip the voltage level at the internal storage nodes Q and QB.

One of the stability problems of an SRAM cell array is associated with half select operating mode. In a half select operating mode, a row of the SRAM array is selected while a column is not, i.e., the word line WL is ON and one or more of the bit line pairs BL and BLB is clamped to a supply voltage (Vdd). During a write operation on a cell, both the row and column of the array are selected. This is illustrated in FIG. 2, which illustrates an SRAM cell array comprising SRAM cells cell00, cell01, cell02, cell10, cell11, cell12, cell20, cell21, and cell22. Each cell is accessed with a corresponding bit line pair (BL0, BL1, or BL2) and a corresponding word line pair (WL0, WL1, or WL2). The bit line pairs BL and BLB are illustrated as (1,0) if the column is selected for writing or (1,1) if the column is not selected. The corresponding word lines WL (WL0, WL1, and WL2) controlled by the word line drivers are turned to a system high voltage (ON) or a system low voltage (OFF). Hence, during the write operation illustrated in FIG. 2, the cell00 is selected, whereas cell01 and cell02 are not selected.

However, during a write operation of the cell00, all the pass-gate transistors of cells in the same row (cell01 and cell02) are turned ON exposing the storage nodes in these adjacent cells. With the pass-gate transistors turned ON for that selected word line, the cross-coupled cell inverters are coupled to the corresponding bit line pairs, partially selecting the cells (half selected) on that word line. Unfortunately, imbalances within the cell can upset half selected cells, or at the very least, become meta-stable at normal design voltages. Thus, due to half select disturbance, cells adjacent to the cell being written may be accidentally disturbed even though the columns for these adjacent cells are OFF. Hence, what is needed are circuits and methods of overcoming half select disturbance for an SRAM cell array.

SUMMARY OF THE INVENTION

These and other problems are generally solved or circumvented, and technical advantages are generally achieved, by embodiments of the present invention.

Embodiments of the invention include SRAM cells. In accordance with an embodiment of the present invention, a static random access memory (SRAM) cell comprises a first inverter, a second inverter cross-coupled with the first inverter to form a first data storage node and a complimentary second data storage node for latching a value. The SRAM cell further comprises a first pass-gate transistor and a switch transistor, the first pass-gate and the switch transistors each having a first source/drain, a second source/drain and a gate. The first source/drain of the first pass-gate transistor is coupled to the first data storage node, and the second source/drain of the first pass-gate transistor is coupled to a first bit line. The first source/drain of the switch transistor is coupled to the gate of the first pass-gate transistor.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an SRAM cell array without half select disturbance. The invention may also be applied, however, to other types of devices such as other memory cells and cell arrays.

In various embodiments, the invention improves the cell stability of SRAM cells by avoiding the operation of the SRAM under half select operation mode. In various embodiments, the SRAM cell comprises a switch coupled to a column select line. Unless specifically enabled by the column select line, the switch isolates the SRAM cell from the respective word line, thus avoiding half select operation. Advantageously, the switch is incorporated in the SRAM cell as a transistor with minimal area penalty and without a significant increase in complexity of peripheral circuitry.

The SRAM cell in accordance with embodiments of the invention will be described using FIGS. 3, 5, and 7. An SRAM cell array formed using the SRAM cell will be described in FIG. 8.

Figure 3:
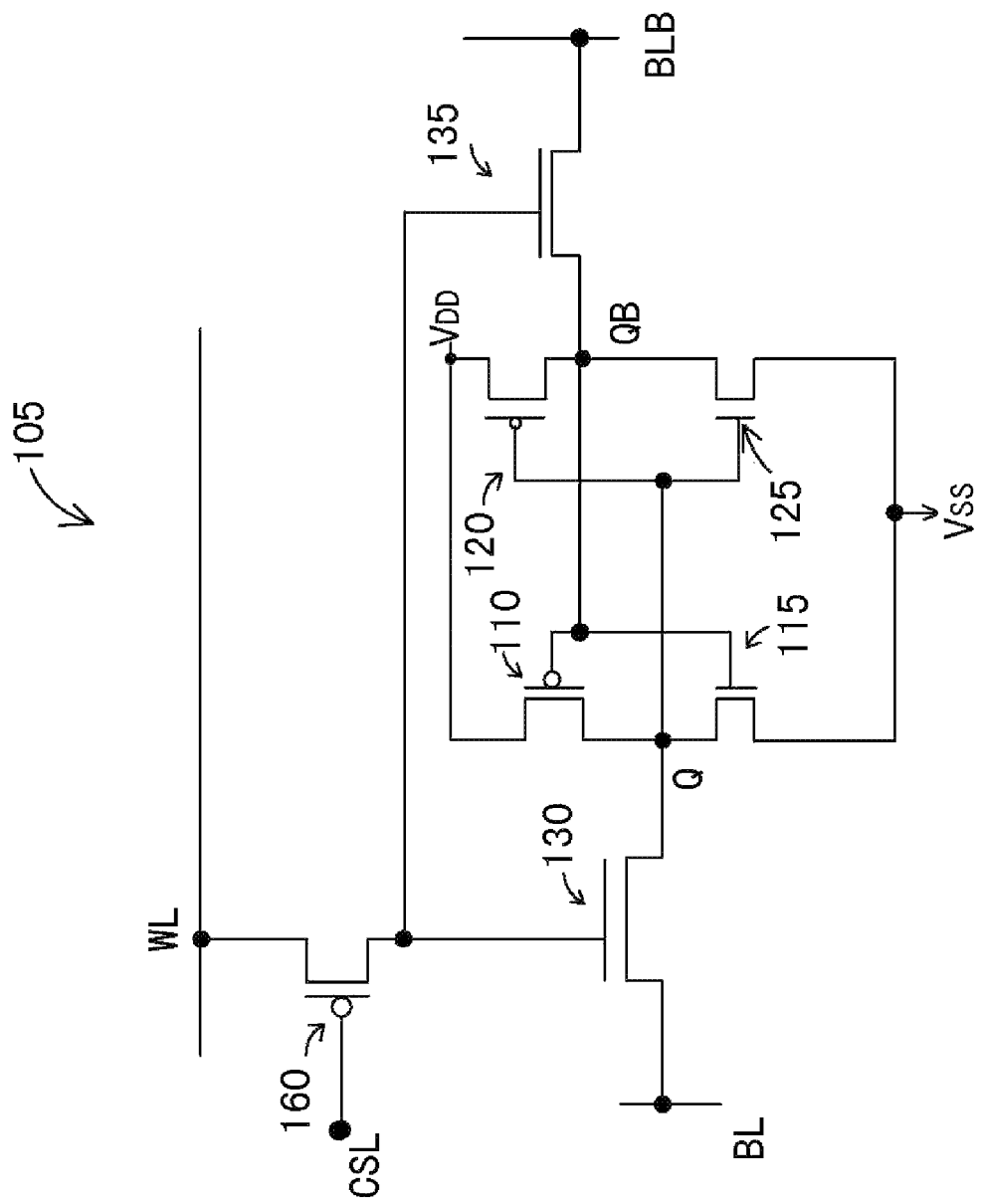
FIG. 3 is a 7-T SRAM cell illustrating the absence of the half select operating mode, in accordance with an embodiment of the invention.

FIG. 3 illustrates an embodiment with a seven-transistor (7-T) SRAM cell 105. Relative to the 6-T SRAM cell 100 shown in FIG. 1, the 7-T SRAM cell 105 comprises a switch transistor 160 coupled to the gate node of the pass-gate transistors 130 and 135. When the column select line CSL is turned ON, the switch transistor 160 is enabled and couples the word line WL to the pass-gate transistors 130 and 135. However, during read or write operations of adjacent cells, the column select line CSL is turned OFF, and the pass-gate transistors 130 and 135 are disconnected from the word line WL preventing half select operation. Thus, the 7-T SRAM cell 105 overcomes the half select disturbance by the use of an additional transistor 160. The corresponding increase in cell area is around 10-20% relative to a corresponding 6-T SRAM cell. Thus, in various embodiments, the 7-T SRAM cell 105 prevents half select disturbance without adding significant complexity or a significant area penalty. In various embodiments, the switch transistor 160 comprises a PMOS transistor.

However, both the 6-T SRAM cell 100 (FIG. 1) and the 7-T SRAM cell 105 (FIG. 3) may suffer from stability issues arising from the read condition. In particular, the read operation affects the stored data in the cell. For example, during the read operation, the pass-gate transistor 130 pulls up the voltage of the node Q storing a "0" state.

Figure 4:
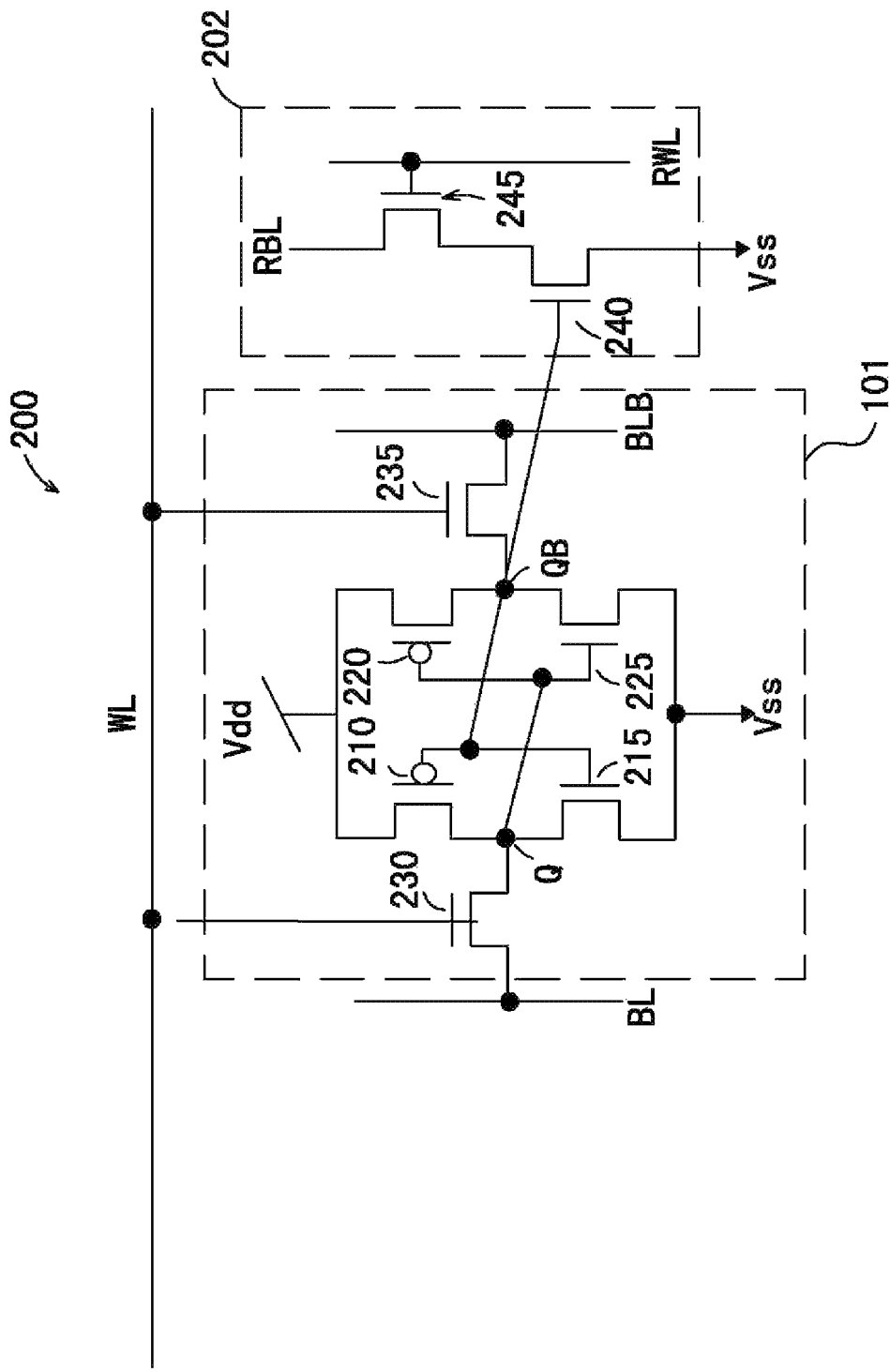
FIG. 4 is a conventional 8-T SRAM cell.

FIG. 4 illustrates an eight-transistor (8-T) dual port SRAM cell 200 that overcomes this limitation. Many applications, such as asynchronous multiprocessor systems, require independent read and write ports so that data may be shared and transmitted between two processors simultaneously. Essentially, the dual port SRAM includes an additional read-port 202 added to the 6-T SRAM cell 100. The read-port 202 comprises a read-port word line RWL, a read-port pass-gate NMOS transistor 245, a read-port pull-down NMOS transistor 240 and a read-port bit line RBL. The read-port pass-gate NMOS transistor 245 is enabled by the read-port word line RWL.

Figure 1:
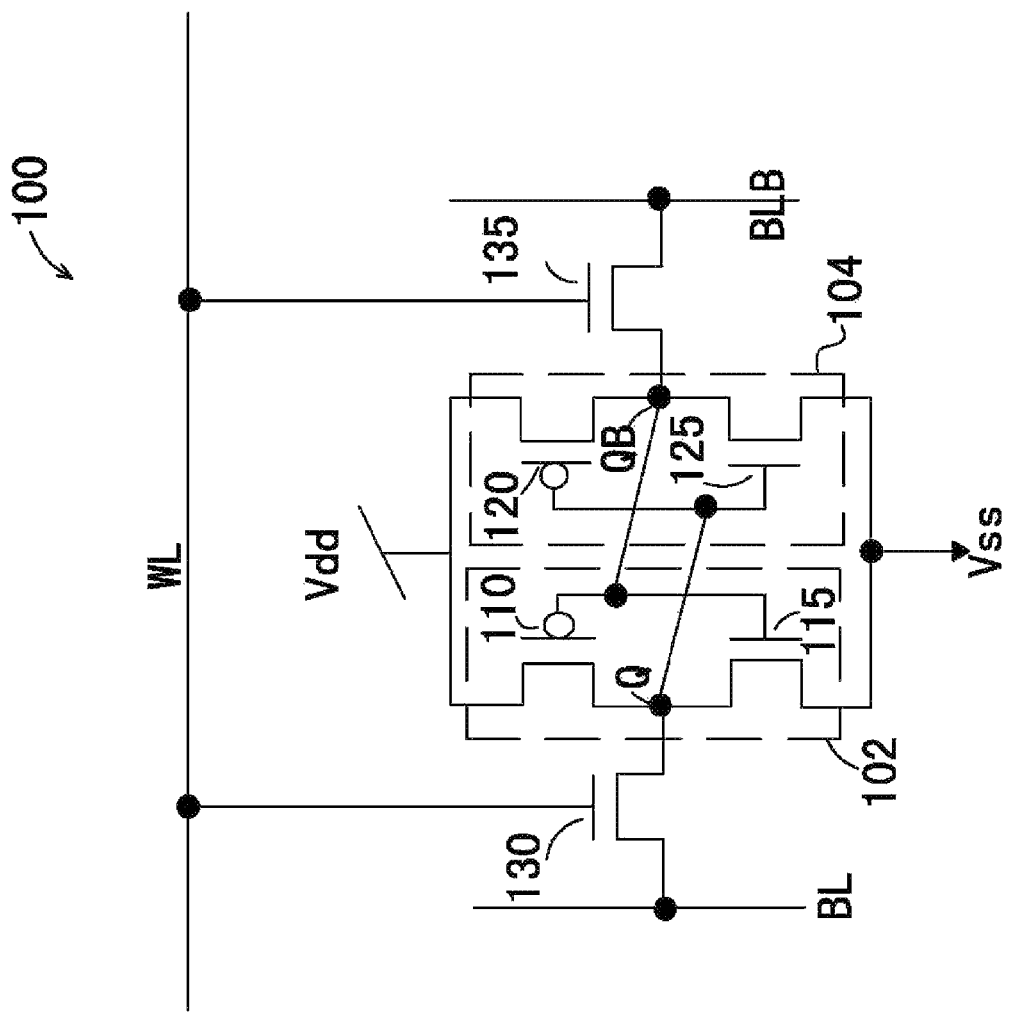
FIG. 1 is a conventional 6-T SRAM cell.

The 8-T SRAM cell 200 comprises two cross-coupled inverters as in the 6-T SRAM cell (FIG. 1). Each inverter comprises an NMOS pull-down transistor 215 or 225 and a PMOS pull-up transistor 210 or 220. The cross-coupled inverters form a latch for storing two storage nodes Q and QB. A complementary bit line pair BL and BLB is coupled to the pair of storage nodes Q and QB via a pair of pass-gate transistors 230 and 235, respectively. The gates of the pass-gate transistors 230 and 235 are coupled together and connected to a word line WL.

Similar to the 6-T SRAM cell 100 in FIG. 1, in FIG. 4, the cell 101 within the 8-T dual port SRAM cell 200 can still perform read and write operations. However, the separate read-port 202 allows independent read operations. For reading through the read-port 202, the read-port bit line RBL is pre-charged, e.g., to a supply voltage Vdd. The read-port word line RWL is asserted turning on the read-port pass-gate NMOS transistor 245. If the node QB is high, the read-port pull-down NMOS transistor 240 is activated, pulling down the read-port bit line RBL to a ground potential. However, if the QB is low, the gate voltage on the read-port pull-down NMOS transistor 240 is not sufficient to activate the read-port pull-down NMOS transistor 240, thus isolating the read-port bit line RBL. A sensing circuit detects the voltage at the read-port bit line RBL. Thus, the 8-T dual port SRAM cell 200 may read using read-port 202 or directly from the cell 101 (as in the conventional 6-T SRAM cell described in FIG. 1). However, during the data write cycle, only cell 101 is accessible.

Advantageously, using the read-port 202 of the 8-T SRAM cell 200, the gate electrode of the read-port pull-down NMOS transistor 240 receives the storage node voltage directly. Therefore, the data stored in the storage node QB is not affected during the read operation through the read-port 202. While the 8-T SRAM cell 200 eliminates read and write disturbs (since there is no sharing of the read and write word lines), it is nevertheless susceptible to half select disturbance.

Figure 5:
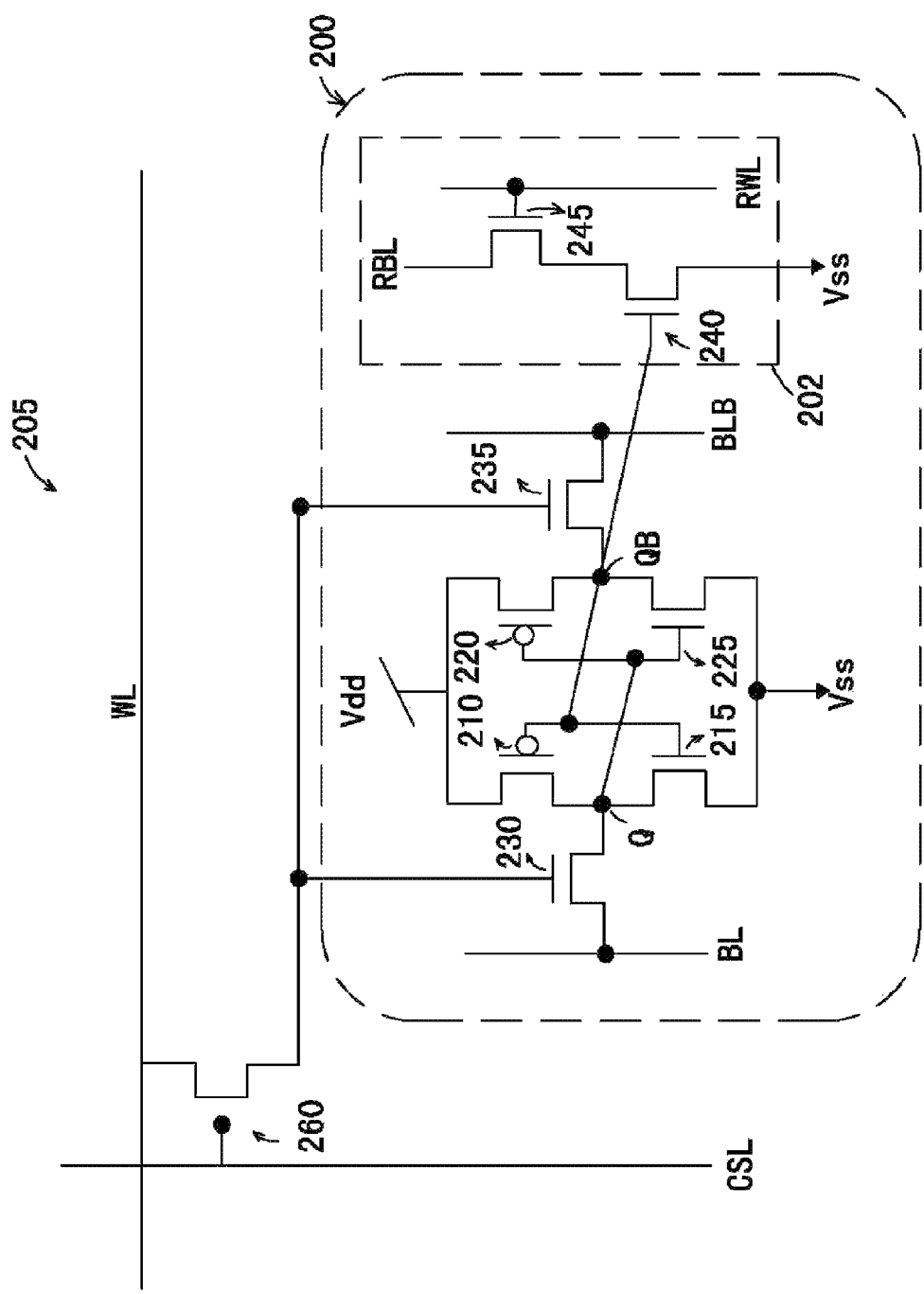
FIG. 5 is a 9-T SRAM cell illustrating the absence of the half select operating mode, in accordance with an embodiment of the invention.

FIG. 5 is an embodiment of the invention illustrating a 9-T SRAM cell 205 without the half cell disturbance. The 9-T SRAM cell 205 includes the transistors of the 8-T SRAM cell illustrated in FIG. 4. However, in addition the 9-T SRAM cell 205 includes a switch transistor 260, which is coupled to the gate node of the pass-gate transistors 230 and 235. When the column select line CSL is turned ON, the switch transistor 260 is enabled and couples the word line WL to the pass-gate transistors 230 and 235. However, during read or write operations of adjacent cells, the column select line CSL is turned OFF, and hence the pass-gate transistors 230 and 235 are disconnected from the word line WL, thus preventing half select disturbance. In various embodiments, the 9-T SRAM cell 205 prevents half select disturbance without adding significant complexity or a significant area penalty. In various embodiments, the switch transistor 260 comprises a PMOS transistor.

Figure 6:
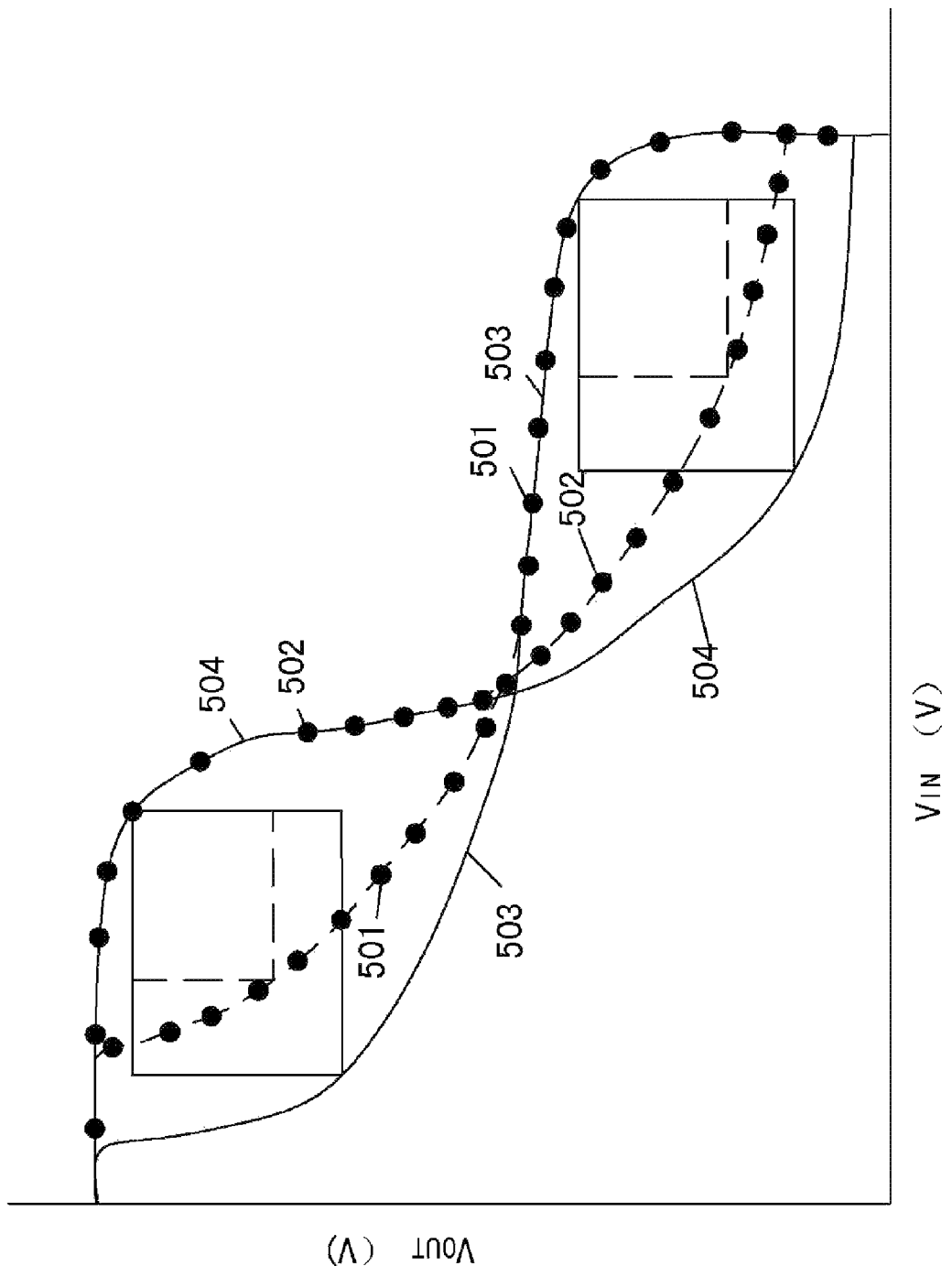
FIG. 6 is a butterfly plot of a 9-T SRAM cell illustrating the improvement in static noise margin, in accordance with an embodiment of the invention.

FIG. 6 illustrates the butterfly plot for a 9-T SRAM cell (FIG. 5) showing the impact of the additional switch transistor on SNM. The curves 501 and 502 (dashed lines) represent the voltage transfer curves of each of the cross-coupled inverters within the SRAM cell when the word line is asserted and if the column select line CSL is turned ON (or for an 8-T SRAM cell as illustrated in FIG. 4). The length of a side of the largest square within the voltage transfer curves of the inverters is a measure of the hold margin of the SRAM cell before a stored data state is flipped, and hence indicates the stability of the cell to noise.

Alternatively, the curves 503 and 504 (solid lines) are produced if the column select line CSL is turned OFF, isolating the word line WL from the cross-coupled inverters. Hence, the SNM for the curves 503 and 504 approaches the ideal SNM of the cross-coupled inverters of the SRAM cell. A substantial improvement in cell stability is thus achieved using embodiments of the invention.

Figure 7:
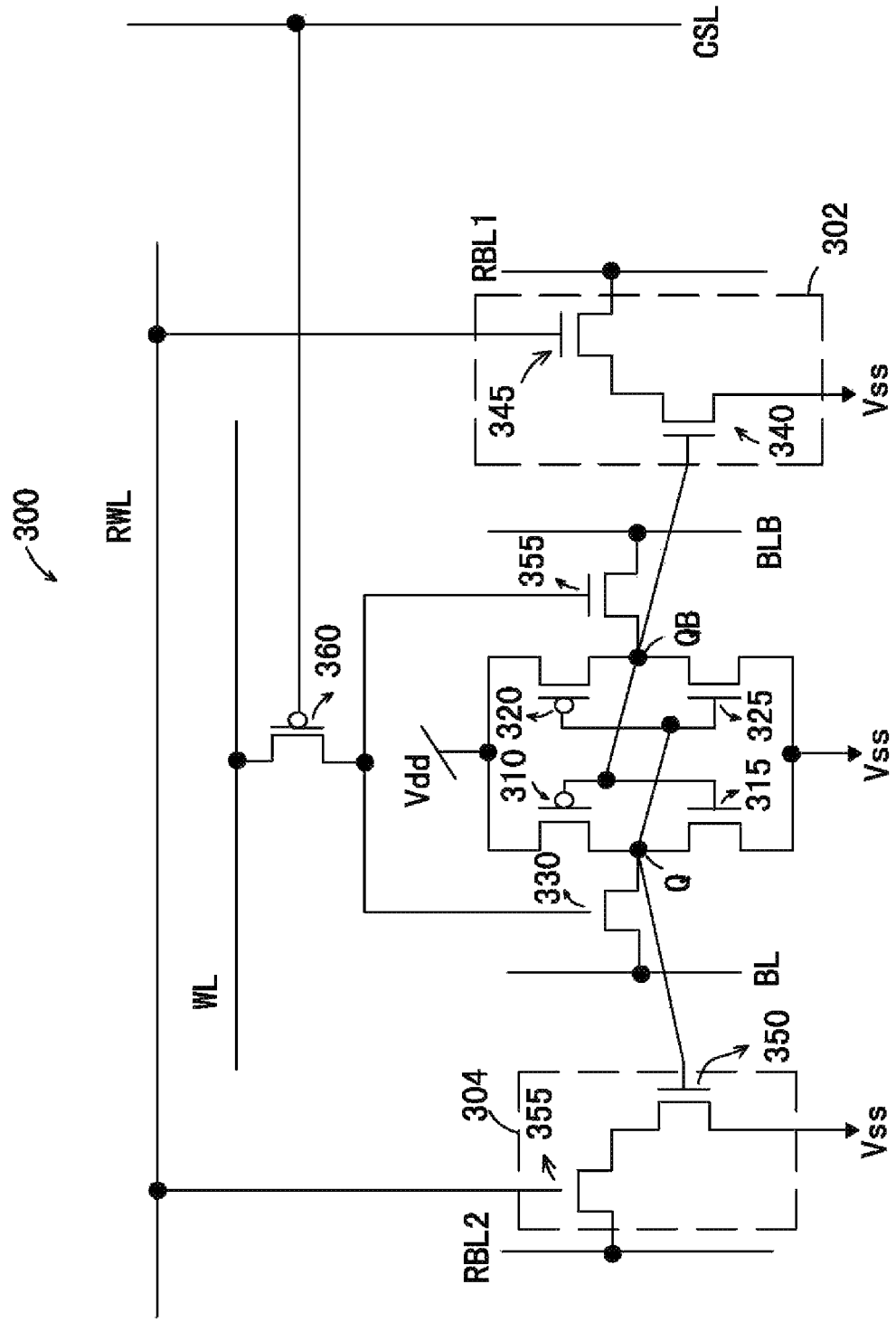
FIG. 7 is an 11-T SRAM cell illustrating the absence of the half select operating mode, in accordance with an embodiment of the invention.

FIG. 7 illustrates an eleven-transistor (11-T) SRAM cell 300 in accordance with an embodiment of the invention.

As in the 6-T SRAM cell, the 11-T SRAM cell 300 comprises two cross-coupled inverters latching a value in two storage nodes Q and QB. Each inverter comprises an NMOS pull-down transistor 315 or 325 and a PMOS pull-up transistor 310 or 320. Similarly, a complementary bit line pair BL and BLB is coupled to a pair of pass-gate transistors 330 and 335, respectively, and the gates of the pass-gate transistors 330 and 335 are connected to a word line WL.

Further, similar to the 8-T SRAM (FIG. 4), the 11-T SRAM cell 300 includes independent read-ports to read data stored in the storage nodes Q and QB. However, unlike the 8-T SRAM, which has a single read-port, the 11-T SRAM cell 300 includes two read-ports 302 and 304.

The circuitry of both the read-ports 302 and 304 is similar to the read-port circuitry described for the read-port 202 of FIG. 4. Each additional read-port 302 or 304 comprises a read-port pass-gate NMOS transistor 345 or 355, a read-port pull-down NMOS transistor 340 or 350, and a read-port bit line RBL1 or RBL2, respectively. The read-port pass-gate NMOS transistors 345 and 355 are coupled to a read-port word line RWL.

In addition, the 11-T SRAM cell 300 includes a switch transistor 360, which is coupled to the gate node of the pass-gate transistors 330 and 335. When the column select line CSL is turned ON, the switch transistor 360 is enabled and couples the word line WL to the pass-gate transistors 330 and 335. As described above (e.g., with respect to FIGS. 3 and 5), the use of the switch transistor 360 along with the column select line CSL improves the hold margin of the 11-T SRAM cell 300 by avoiding the half select operating mode.

Figure 2:
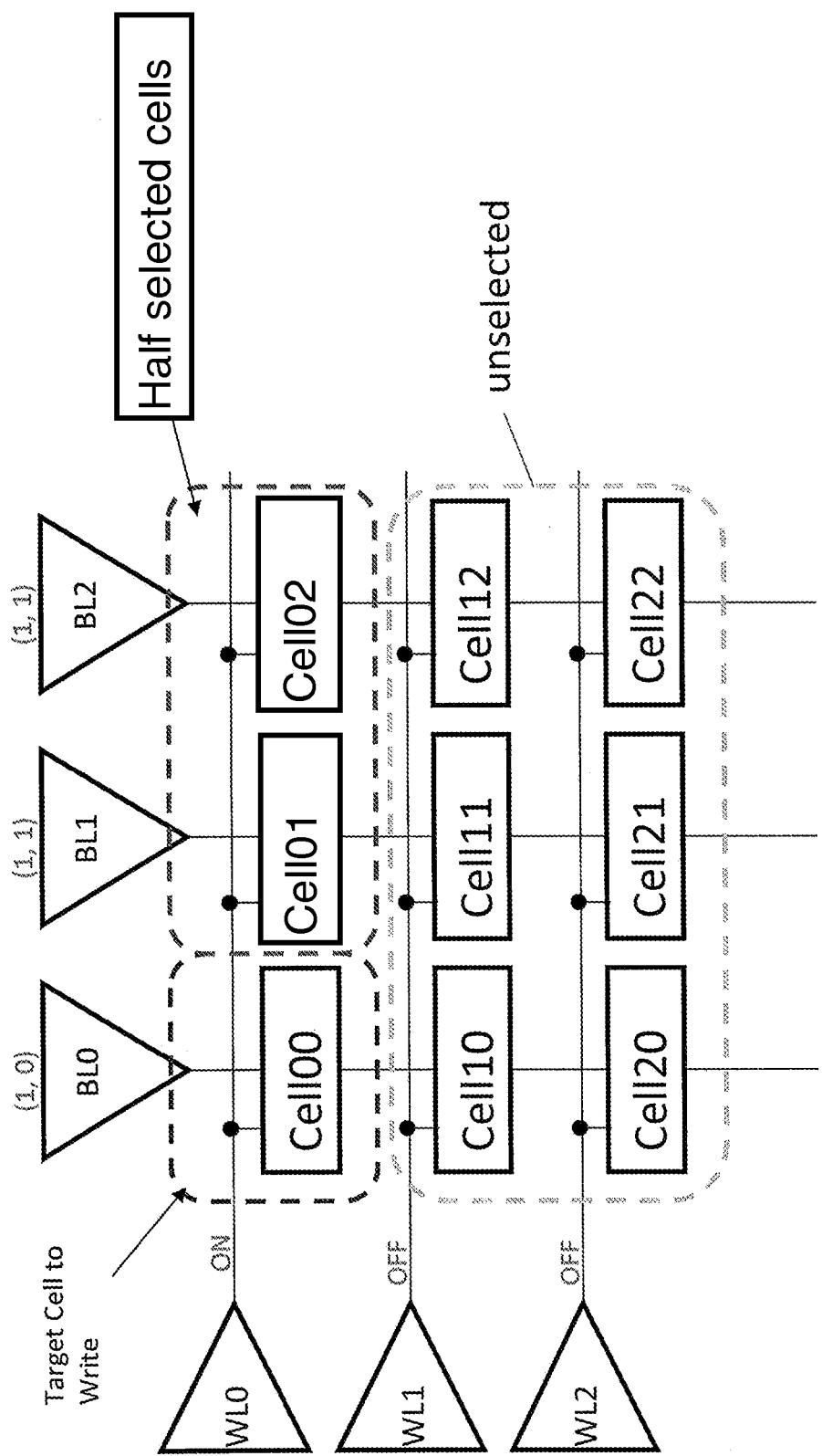
FIG. 2 illustrates an SRAM cell array comprising a plurality of SRAM cells arranged in rows and columns, each row accessed by a plurality of word lines and bit lines.
Figure 8:
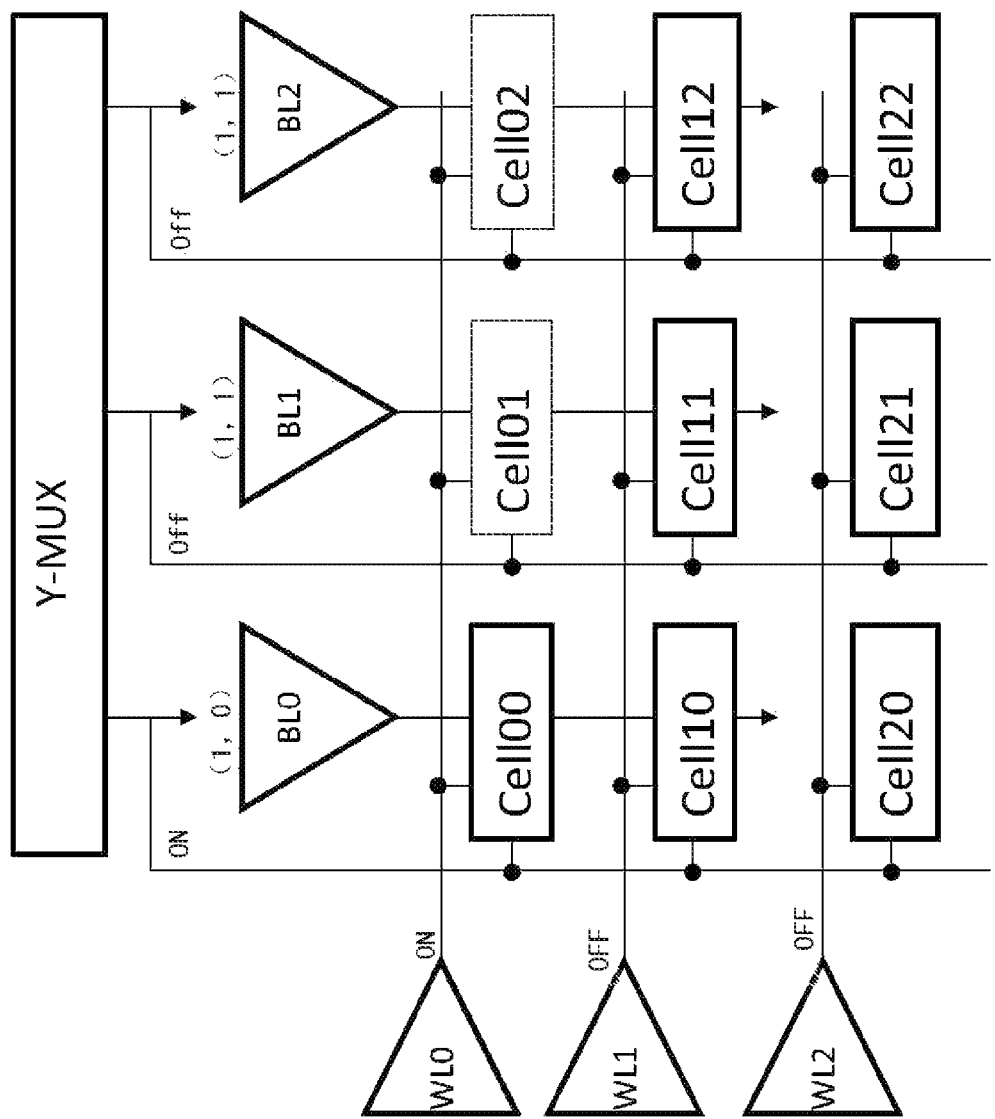
FIG. 8 illustrates an SRAM cell array comprising a plurality of SRAM cells arranged in rows and columns, each row accessed by a plurality of word lines, bit lines and column select lines, in accordance with an embodiment of the invention.

FIG. 8 is an embodiment of the invention illustrating an SRAM array including the additional switch transistor, wherein each SRAM cell comprises either a 7-T, 9-T, or a 11-T SRAM cell (e.g., as described in FIG. 3, 5, or 7). Similar to FIG. 2, the SRAM cell array comprises SRAM cells cell00, cell01, cell02, cell10, cell11, cell12, cell20, cell21, and cell22. Each cell in the SRAM cell array is accessed with a corresponding bit line pair (BL0, BL1, or BL2) and a corresponding word line pair (WL0, WL1, or WL2). The bit line pairs BL and BLB are illustrated as (1,0) if the column is selected for writing or (1,1) if the column is not selected. The corresponding word lines WL (WL0, WL1, WL2) controlled by the word line drivers are turned to high (ON) or low (OFF).

Further, the column select line CSL is coupled to the output of a y-decoder or multiplexer Y-MUX that selects the column to be written.

If a particular column is to be selected, the y-decoder output is switched to high turning ON the switch transistor (e.g., switch transistor 160 in FIG. 3 or switch transistor 260 in FIG. 5). Subsequently, the word line is asserted on the gates of the pass-gate transistors of the cells (e.g., pass-gate transistors 230 and 235 in the 9-T SRAM cell illustrated in FIG. 5).

However, if the column is not selected, the output of the y-decoder Y-MUX is switched to low, turning OFF the corresponding switch transistor in each SRAM cell. Consequently, the pass-gate transistors in the unselected column are isolated from the word line, avoiding the half select operating mode. For example, even if the word line WL0 is asserted, the pass-gate transistors of unselected cells (cell01 and cell02) are not activated because the column select line CSL is OFF.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, layout, and circuits described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A static random access memory (SRAM) cell comprising:
   a first inverter;
   a second inverter cross-coupled with the first inverter to form a first data storage node and a complimentary second data storage node for latching a value;
   a first pass-gate transistor having a first source/drain, a second source/drain and a gate, wherein the first source/drain of the first pass-gate transistor is coupled to the first data storage node, and the second source/drain of the first pass-gate transistor is coupled to a first bit line; and
   a switch transistor having a first source/drain, a second source/drain and a gate, wherein the first source/drain of the switch transistor is coupled to the gate of the first pass-gate transistor.

2. The SRAM cell of claim 1, wherein the gate of the switch transistor is coupled to a column select line, and wherein the second source/drain of the switch transistor is coupled to a word line.

3. The SRAM cell of claim 1, wherein the first pass-gate transistor is an NMOS transistor, and wherein switch transistor is a PMOS transistor.

4. The SRAM cell of claim 1, wherein the first inverter comprises a first pull-up transistor and a first pull-down transistor, and wherein the second inverter comprises a second pull-up transistor and a second pull-down transistor.

5. The SRAM cell of claim 4, wherein the first and the second pull-up transistors comprise PMOS transistors, and wherein the first and the second pull-down transistors comprise NMOS transistors.

6. The SRAM cell of claim 1, further comprising:
   a second pass-gate transistor having a first source/drain, a second source/drain and a gate, wherein the first source/drain of the second pass-gate transistor is coupled to the second data storage node, and the second source/drain of the second pass-gate transistor is coupled to a second bit line, and wherein the first source/drain of the switch transistor is coupled to the gate of the second pass-gate transistor.

7. The SRAM cell of claim 1, further comprising:
   a first read-port pull-down transistor having a first source/drain, a second source/drain and a gate, wherein the gate of the first read-port pull-down transistor is coupled to the second data storage node; and
   a first read-port pass-gate transistor having a first source/drain, a second source/drain and a gate, wherein the first source/drain of the first read-port pass-gate transistor is coupled to the first source/drain of the first read-port pull-down transistor, wherein the second source/drain of the first read-port pass-gate transistor is coupled to a first read bit line, and wherein the gate of the first read-port pass-gate transistor is coupled to a read word line.

8. The SRAM cell of claim 7, further comprising:
   a second read-port pull-down transistor having a first source/drain, a second source/drain and a gate, wherein the gate of the second read-port pull-down transistor is coupled to the first data storage node; and
   a second read-port pass-gate transistor having a first source/drain, a second source/drain and a gate, wherein the first source/drain of the second read-port pass-gate transistor is coupled to the first source/drain of the second read-port pull-down transistor, wherein the second source/drain of the second read-port pass-gate transistor is coupled to a second read bit line, and wherein the gate of the second read-port pass-gate transistor is coupled to the read word line.

9. A static random access memory (SRAM) cell comprising:
   a first inverter;
   a second inverter, an output of the first inverter being coupled to an input of the second inverter, an output of the second inverter being coupled to an input of the first inverter to form a first data storage node and a complimentary second data storage node for latching a value;
   a switch enabled by a column select line; and
   a first pass-gate transistor disposed between a first bit line and the first data storage node, wherein the switch if enabled by the column select line couples a word line to a gate of the first pass-gate transistor.

10. The SRAM cell of claim 9, wherein the switch comprises a PMOS transistor having a first source/drain, a second source/drain and a gate, wherein the gate of the PMOS transistor is coupled to the column select line, wherein the first source/drain of the PMOS transistor is coupled to the gate of the first pass-gate transistor, and wherein the second source/drain of the PMOS transistor is coupled to the word line.

11. The SRAM cell of claim 9, wherein the first inverter comprises a first pull-up PMOS transistor and a first pull-down NMOS transistor, and wherein the second inverter comprises a second pull-up PMOS transistor and a second pull-down NMOS transistor.

12. The SRAM cell of claim 9, further comprising:
a second pass-gate transistor disposed between a second bit line and the second data storage node, wherein the switch if enabled by the column select line couples the word line to a gate of the second pass-gate transistor.

13. The SRAM cell of claim 9, further comprising:
a first read-port pull-down transistor having a first source/drain, a second source/drain and a gate, wherein the gate of the first read-port pull-down transistor is coupled to the second data storage node; and
a first read-port pass-gate transistor having a first source/drain, a second source/drain and a gate, wherein the first source/drain of the first read-port pass-gate transistor is coupled to the first source/drain of the first read-port pull-down transistor, wherein the second source/drain of the first read-port pass-gate transistor is coupled to a first read bit line, and wherein the gate of the first read-port pass-gate transistor is coupled to a read word line.

14. The SRAM cell of claim 13, further comprising:
a second read-port pull-down transistor having a first source/drain, a second source/drain and a gate, wherein the gate of the second read-port pull-down transistor is coupled to the first data storage node; and
a second read-port pass-gate transistor having a first source/drain, a second source/drain and a gate, wherein the first source/drain of the second read-port pass-gate transistor is coupled to the first source/drain of the second read-port pull-down transistor, wherein the second source/drain of the second read-port pass-gate transistor is coupled to a second read bit line, and wherein the gate of the second read-port pass-gate transistor is coupled to the read word line.

15. A static random access memory (SRAM) cell array having a plurality of SRAM cells arranged in a plurality of rows and columns, the array comprising:
a plurality of bit line pairs and a plurality of column select lines for accessing a column of the plurality of columns; and
a plurality of word lines for accessing a row of the plurality of rows, wherein each SRAM cell in the SRAM cell array comprising:
a first inverter,
a second inverter cross-coupled with the first inverter to form a first data storage node and a complimentary second data storage node,
a switch transistor enabled by a column select line of the plurality of column select lines, and
a first pass-gate transistor disposed between a first bit line of the plurality of bit line pairs and the first data storage node, wherein the first pass-gate transistor is enabled by the switch transistor.

16. The SRAM cell array of claim 15, wherein a gate of the switch transistor is coupled to the column select line, wherein a first source/drain of the switch transistor is coupled to the gate of the pass-gate transistor, and wherein a second source/drain of the switch transistor is coupled to a word line of the plurality of word lines.

17. The SRAM cell array of claim 15, wherein the first inverter comprises a first pull-up PMOS transistor and a first pull-down NMOS transistor, and wherein the second inverter comprises a second pull-up PMOS transistor and a second pull-down NMOS transistor.

18. The SRAM cell array of claim 15, further comprising:
a second pass-gate transistor disposed between a second bit line of the plurality of bit line pairs and the second data storage node, wherein the second pass-gate transistor is enabled by the switch transistor.

19. The SRAM cell array of claim 15, further comprising:
a first read-port pull-down transistor having a first source/drain, a second source/drain and a gate, wherein the gate of the first read-port pull-down transistor is coupled to the second data storage node; and
a first read-port pass-gate transistor having a first source/drain, a second source/drain and a gate, wherein the first source/drain of the first read-port pass-gate transistor is coupled to the first source/drain of the first read-port pull-down transistor, wherein the second source/drain of the first read-port pass-gate transistor is coupled to a first read bit line, and wherein the gate of the first read-port pass-gate transistor is coupled to a read word line.

20. The SRAM cell array of claim 19, further comprising:
a second read-port pull-down transistor having a first source/drain, a second source/drain and a gate, wherein the gate of the second read-port pull-down transistor is coupled to the first data storage node; and
a second read-port pass-gate transistor having a first source/drain, a second source/drain and a gate, wherein the first source/drain of the second read-port pass-gate transistor is coupled to the first source/drain of the second read-port pull-down transistor, wherein the second source/drain of the second read-port pass-gate transistor is coupled to a second read bit line, and wherein the gate of the second read-port pass-gate transistor is coupled to the read word line.

* * * * *